(12) United States Patent
Sugimura et al.

(10) Patent No.: US 7,300,517 B2
(45) Date of Patent: Nov. 27, 2007

(54) MANUFACTURING METHOD OF HYDROGEN-DOPED SILICON SINGLE CRYSTAL

(75) Inventors: Wataru Sugimura, Tokyo (JP); Masataka Hourai, Tokyo (JP)

(73) Assignee: Sumco Corporation, Tokyo (JP)

( * ) Notice: Subject to any disclaimer, the term of this patent is extended or adjusted under 35 U.S.C. 154(b) by 186 days.

(21) Appl. No.: 11/194,470

(22) Filed: Aug. 2, 2005

(65) Prior Publication Data

US 2007/0028832 A1    Feb. 8, 2007

(51) Int. Cl.
*C30B 15/20*    (2006.01)
(52) U.S. Cl. ............................... 117/19; 117/20
(58) Field of Classification Search ............... 117/19, 117/20
See application file for complete search history.

(56) References Cited

FOREIGN PATENT DOCUMENTS

| JP | 61-178495 | 8/1986 |
|---|---|---|
| JP | 11-189495 | 7/1999 |
| JP | 2000-281491 | 10/2000 |
| JP | 2001-335396 | 12/2001 |

*Primary Examiner*—Felisa Hiteshew
(74) *Attorney, Agent, or Firm*—Pillsbury Winthrop Shaw Pittman, LLP

(57) ABSTRACT

A manufacturing method of a hydrogen-doped silicon single crystal. A silicon single crystal is grown under an inert atmosphere containing hydrogen in a CZ pulling furnace comprising a pull chamber connected to a main chamber. At least one portion of a mixed gas composed of a hydrogen gas and an inert gas to be introduced into the CZ pulling furnace is supplied directly to a surface of a silicon melt in the main chamber, preferably to adjacent parts to a solid-liquid interface of the surface thereof, or in the silicon melt.

5 Claims, 3 Drawing Sheets

US 7,300,517 B2

MANUFACTURING METHOD OF HYDROGEN-DOPED SILICON SINGLE CRYSTAL

CROSS REFERENCE TO RELATED APPLICATIONS

This application is related to, but does not claim priority from, Japanese Patent Application No. 2003-005935, filed on Jan. 14, 2003, the contents of which are incorporated herein in their entirety by reference.

BACKGROUND OF THE INVENTION

1. Field of the Invention

The invention relates to a manufacturing method of a hydrogen-doped silicon single crystal, in which a silicon single crystal is grown by the CZ method under an inert atmosphere containing hydrogen.

2. Description of Related Art

One of the typical manufacturing methods of a silicon single crystal for a base material of a silicon wafer is a rotation pulling method referred to as the CZ method (Czochralski method). The manufacture of a silicon single crystal by the CZ method is performed with known steps including dipping a seed crystal in silicon melt formed in a quartz crucible, and then pulling the seed crystal up while the crucible and seed crystal are being rotated, to grow a silicon single crystal beneath the seed crystal.

For the atmosphere for the CZ pulling, inert gases (mainly Ar gas) have been traditionally applied to suppress various chemical reactions between silicon melt, furnace member and a crystal, and to avoid contamination of impurities produced as by-product. Furthermore, avoidance of metal contamination by utilizing gas flow in the furnace generated by an abundant gas supply improves a quality of the pulled-up crystal.

With regard to the furnace atmosphere, the effect of mixing minute amounts of hydrogen gas therein has been currently reported (for example, Japanese Unexamined Patent Application, First Publication No. S61-178495, Japanese Unexamined Patent Application, First Publication No. H11-189495, Japanese Unexamined Patent Application, First Publication No. 2000-281491, and Japanese Unexamined Patent Application, First Publication No. 2001-335396). According to his technology, hydrogen can reduce or eliminate vacancy defects by acting on Grown-in defects, especially on vacancy defects represented by COP, induced in a crystal, to the same extent as similar to nitrogen doping for silicon melt.

In such hydrogen doping technologies in the CZ pulling, a mixture of hydrogen gas and inert gas is introduced into the furnace instead of the inert gas alone. The mixed gas is introduced from a top of a pull chamber and exhausted from a bottom of a main chamber to the outside of the furnace, to replace the entire interior of the furnace with a predetermined atmosphere, as performed with inert gas in the conventional CZ pulling. In other words, the mixed gas passes through from an uppermost part to a lowermost part in the CZ pulling furnace.

It has, however, been found that a mixed gas introduction mode cannot allow the hydrogen gas in the mixed gas to effectively inhibit the formation of vacancy defects. This is reasoned as follows.

The primary object of hydrogen-gas doping is to inhibit aggregation of vacancies in silicon by couple hydrogen with the vacancies before the vacancies causing COP aggregate themselves. For this purpose, it is necessary to supply hydrogen gas to silicon before the silicon is cooled down to a temperature of vacancy aggregation (around solidification temperature of a melt). The hydrogen gas introduced into a furnace is supplied to the external surface of a pulled-up crystal, but hardly influences the crystal quality. This is because, in considering the times for pulling up and the diffusion distance of a hydrogen atom in silicon, the hydrogen entered into the crystal from its external surface does not reach the core of the crystal, thereby it does not exert an effect of inhibiting COP formed in the crystal cores. Therefore, to effectively contribute to quality improvement, it is advantageous that the crystal be grown from a silicon melt containing hydrogen after a pre-determined amount of hydrogen gas has been supplied to a surface of the melt in a crucible. For such a purpose, it is advantageous that the hydrogen gas be directly supplied to a location adjacent to a solid-liquid interface or in a silicon melt.

However, the crucible storing the silicon melt is placed in a main chamber at a lower part of the CZ pulling furnace significantly distant from the mixed gas inlet. The hydrogen gas in the mixed gas is easily adsorbed by an internal surface of the pulling furnace or various members in the furnace, especially by carbon members. Furthermore, an allowable amount of the hydrogen gas is restricted to minute amount, at most 3% by volume, in view of preventing an explosion. Therefore the hydrogen gas introduced into the furnace seldom reaches the surface of a melt in the crucible, and the generation of COP is not inhibited effectively.

The object of the invention is to provide a manufacturing method of a hydrogen-doped silicon single crystal, wherein the method can produce a high quality hydrogen-doped silicon single crystal by the CZ method without increasing the concentration of hydrogen gas in a mixed gas.

To achieve the object, the inventors have extensively studied ways to supply hydrogen gas, wherein a silicon single crystal is grown by the CZ method under an inert atmosphere containing hydrogen; and therefore, have reached the following conclusions.

As stated above, to allow hydrogen gas to effectively act on COP inhibition, some amount of hydrogen gas must be supplied to a surface of a melt in a crucible, especially to a part adjacent to a solid-liquid interface of the melt surface. The major factor restricting such supply is that, since a minute amount of hydrogen gas contained in a mixed gas is introduced into an uppermost part of the chamber mostly distant from a crucible storing a silicon melt, the hydrogen gas travels through a long passage to reach the silicon melt and is adsorbed by an internal surface of the CZ pulling furnace or various members in the furnace, especially by carbon members, on the way through such a passage.

Therefore, to allow hydrogen gas to effectively act on COP inhibition, it is necessary to shorten the passage in a furnace for the hydrogen gas to travel through after being injected into the furnace until reaching the silicon melt.

The present invention has been accomplished based on this view point.

SUMMARY OF THE INVENTION

In a manufacturing method of a hydrogen-doped silicon single crystal of the invention, a silicon single crystal is, under an inert gas atmosphere containing hydrogen, grown in a CZ pulling furnace having a pull chamber connected to main chamber. At least a portion of the mixed gas composed of a hydrogen gas and an inert gas for introducing into the pulling furnace is directly supplied to a surface of a silicon melt in the main chamber, preferably to adjacent part to a solid-liquid interface on a surface of the silicon melt.

The manufacturing method of a hydrogen-doped silicon single crystal may supply at least a portion of the mixed gas composed of a hydrogen gas and an inert gas directly into silicon melt during crystal growth process in a CZ furnace.

In the manufacturing method of a hydrogen-doped silicon single crystal of the invention, the passage on which the mixed gas introduced into the furnace travels to reach a silicon melt in a crucible, is shortened, and by avoiding the possibility for the hydrogen colliding with internal members of the furnace on the way through the passage, adsorption of the hydrogen gas is suppressed and its utility is enhanced. Consequently, desired amounts of hydrogen can be doped in a crystal via the silicon melt without increasing hydrogen gas concentration in the mixed gas or flow rate thereof. Supplying the gas to the silicon melt also enhance the hydrogen gas utility because the hydrogen gas is efficiently introduced into a silicon before solidification to effectively suppress vacancy aggregation.

In view of efficiency, to supply mixed gas to the surface of silicon melt directly, it is preferable to spray the mixed gas onto a surface of the silicon melt, preferably to adjacent part to a solid-liquid interface on the surface thereof, from a circular gas-discharge units which is placed adjacent to the surface of the silicon melt and encircling the silicon single crystal in the main chamber.

DETAILED DESCRIPTION OF THE INVENTION

Figure 1:
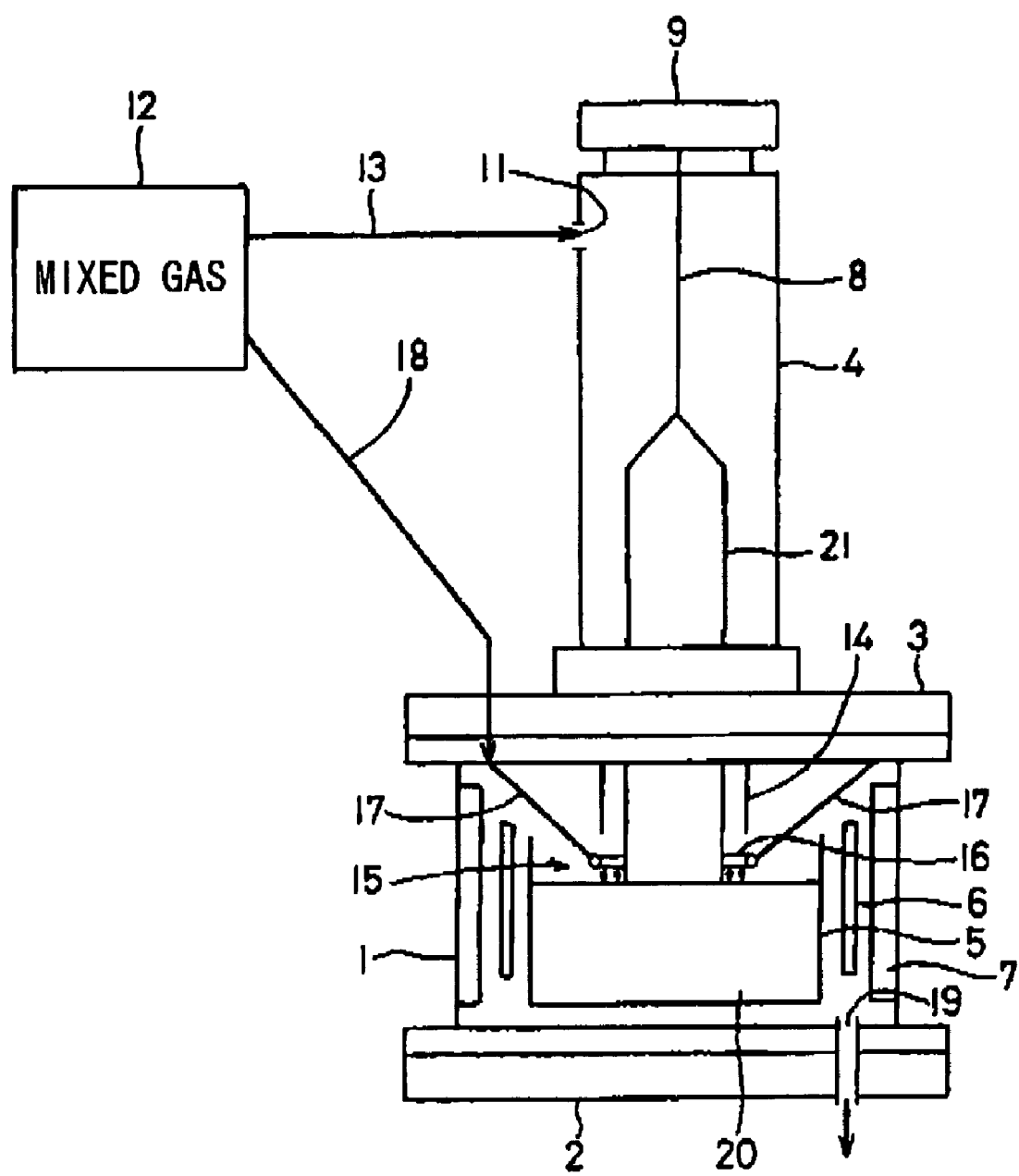
FIG. 1 is a schematic view of a CZ pulling furnace suitable for a manufacturing method of a hydrogen-doped silicon single crystal according to the invention.

The embodiments of the invention are explained with reference to the drawings. FIG. 1 is a schematic view of a CZ pulling furnace suitable for a manufacturing method of a hydrogen-doped silicon single crystal according to the invention.

The CZ pulling furnace has, as shown in FIG. 1, a face body including a cylindrical main chamber 1, a base chamber 2 which covers the bottom opening of the main chamber 1, a top chamber 3 which covers the top opening of the main chamber 1, and a long cylindrical pull chamber 4 which is concentrically connected on the main chamber 1 via the top chamber 3.

In the main chamber 1, a crucible 5 is placed at the center of the chamber. The crucible 5 has a double structure composed of an inner quartz crucible retained by an outer graphite crucible, and is supported via a supporting dish by a supporting axis called a pedestal which is inserted in the main chamber 1 penetrating the base chamber 2. The supporting axis is driven in its axial or circumferential direction by a driving mechanism equipped under the base chamber 2, to lift up or down, or rotate the crucible 5.

A circular heater 6 is placed at the outer side of the crucible 5, and an insulator 7 is placed at a further outer side thereof along the inner face of the main chamber 1.

A gas-discharge unit 15 is installed above the crucible 5 in the main chamber 1. The gas-discharge unit 15 has a ring-type header 16 concentrically placed above the crucible 5, and two supporting members 17 and 17 which horizontally suspend the ring type header 16 at a predetermined position above the crucible 5. The ring-type header 16 is a tube formed in a ring shape and has a plurality of nozzle holes formed at equal intervals around the entire circumferences at the bottom thereof. The two supporting members 17 and 17 are tube members which attach on the under face of the top chamber 3 by being directed diagonally toward the inner side of the main chamber 1, and are also used as gas supply tubes to supply a mixed gas to be described hereinafter to the ring-type header 16.

In the pull chamber 4 on the main chamber 1, a wire 8 functioning as a pulling axis is suspended. The wire 8 is wound up and rotated by a driving mechanism 9 mounted on the pull chamber 4.

A gas inlet 11 is equipped at an upper part of the pull chamber 4 to administer atmosphere into the furnace. The gas inlet 11 is connected via a pipe 13 to a gas source 12 which supplies a mixture of hydrogen gas and inert gas. The gas source 12 is connected to the two supporting members 17 and 17, which is also used as gas supply tubes as mentioned above, with a pipe 18 which is independent from the pipe 13. In a lower part of the pull chamber 4, a draw tube 14 which is inserted in the main chamber 1, is equipped. The draw tube 14 is a cylindrical body having a jacket structure for water cooling as well as the wall of the pull chamber 4; the draw tube 14 promotes the cooling of a silicon single crystal pulled up from the silicon melt in the crucible 5, and also works as a rectifying cylinder which rectifies the mixed gas introduced from the gas inlet 11 into the pull chamber 4 and introduces it into the main chamber 1. On the other hand, a gas exhausting hole 19 is equipped in the base chamber 2. The gas exhausting hole 19 is connected to a vacuum pump which is not drawn in the figure.

If the diameter of the draw tube 14 is too large, the effect of cooling the single crystal is reduced; if it is too small, there is a possibility of the crystal falling because, when the crystal is swung during the pulling-up operation, the crystal under growth makes contact with the inner wall of the draw tube 14. In consideration of these possibilities, the diameter of the draw tube 14 is preferably 1.1 to 1.3 times the diameter of grown crystal. With regard to the diameter of the ring-type header 16, if it is too small, there is a possibility of contact with the crystal; if it is too large, the effect of directly spraying the gas onto the interface between the crystal and the melt is reduced; therefore, it is preferably 1.1 to 1.3 times the diameter of the grown crystal.

With regard to the operation, a melt 20 of silicon raw material is first formed in the crucible 5. A seed crystal attached at the lowest end of the wire 8 is dipped in the molten raw material 20. While the crucible 5 and the wire 8 are rotated, the wire 8 is pulled up to grow a silicon single crystal 21 beneath the seed crystal. The grown crystal is gradually drawn into the pull chamber 4 through the insides of the ring-type header 16 and the draw tube 14.

In this procedure, the inside pressure of the furnace is reduced to a pre-determined vacuum by operating the vacuum pump connected to the gas exhausting hole 19; and under this condition, a mixed gas of a hydrogen gas and an inert gas (Ar gas) is introduced into the furnace from the gas source 12 via the pipe 13 and the gas inlet 11. The mixed gas introduced into the furnace via the gas inlet 11 flows into the furnace from top to bottom, and then is exhausted through the gas exhausting hole 19 to the outside of the furnace. Consequently, the furnace inside is entirely maintained under the mixed gas atmosphere.

Along with the above procedures, the mixed gas is supplied from the gas source 12 to the two supporting members 17 and 17 via the other pipe 18. The mixed gas supplied to the supporting members 17 and 17 is sent to the horizontal ring-type header 16, and discharged in a downward direction into the main chamber 1 from the plurality of nozzle holes formed at the bottom of the header 16, without passing through the pull chamber 4. The mixed gas discharged in a downward direction into the main chamber 1 strikes in a pure state at point-blank range mainly with the surface of the molten raw material 20 in the crucible 5, more specifically the surface area covering from the single crystal 21 to its outer peripheral region. Consequently, the hydrogen gas in the mixed gas discharged from the plurality of nozzle holes effectively acts to prevent the single crystal 21 from forming vacancies.

The reason for this effective action is as follows: the mixed gas discharged from the header 16 strikes at point-blank range the surface of the melt in the crucible 5, thus preventing unnecessary hydrogen consumption caused by hydrogen adsorption by the carbon members while the hydrogen gas passes through the furnace; moreover, since the position struck by the mixed gas is mainly the parts adjacent to the solid-liquid interface on the surface of the melt in the crucible 5, this enables the hydrogen in the mixed gas to be efficiently taken in by a silicon before solidification, effectively suppress vacancy aggregation and prevent useless hydrogen intake by the single crystal 21.

As a result of such effective hydrogen intake, the hydrogen is doped by the silicon in a predetermined concentration at the stage before its solidification, thereby resulting in the production of a high quality hydrogen-doped silicon single crystal 21 in which the generation of vacancy defects is effectively suppressed.

Figure 2:
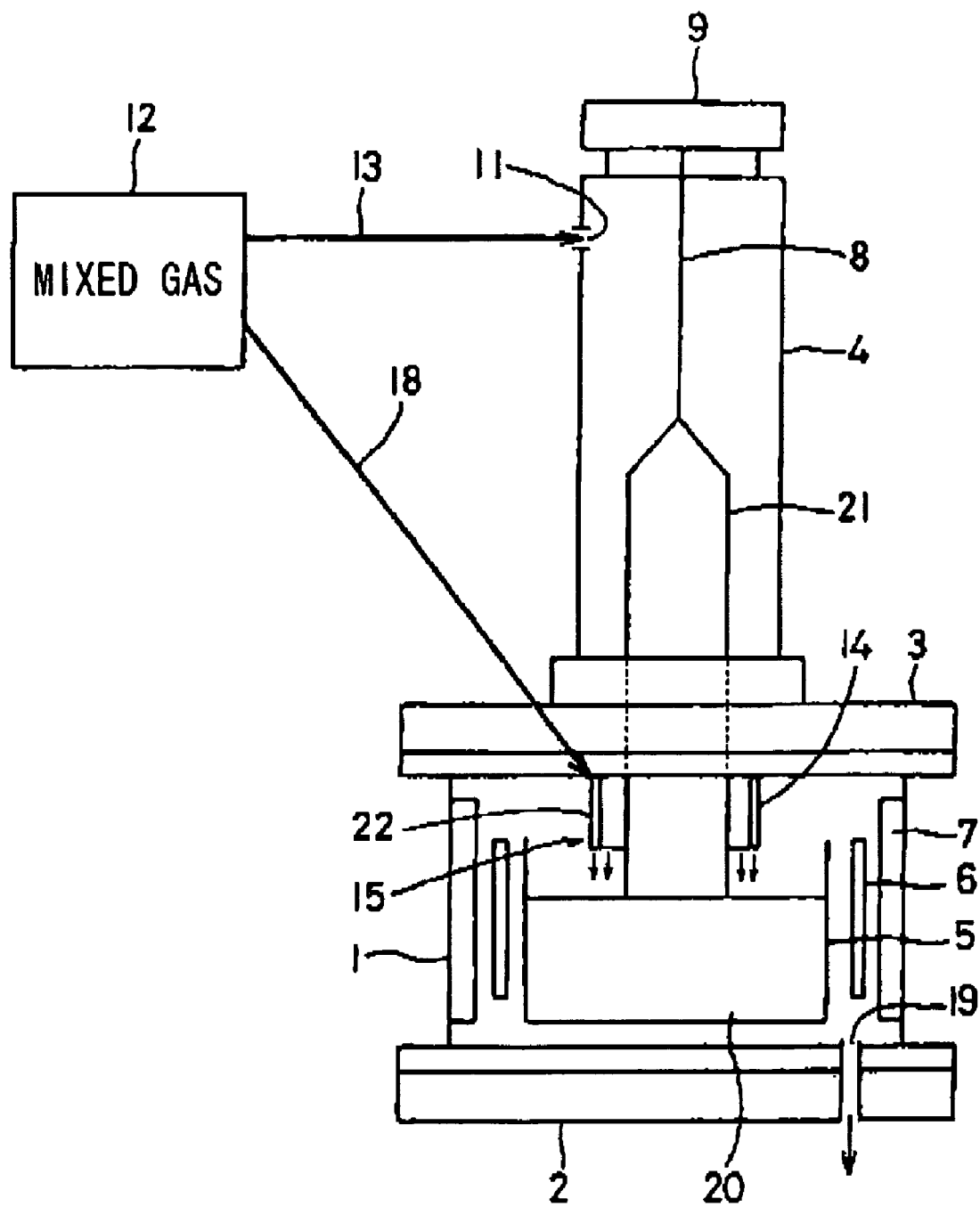
FIG. 2 is a schematic view of another CZ pulling furnace suitable for a manufacturing method of a hydrogen-doped silicon single crystal according to the invention.

FIG. 2 is a schematic view of another CZ pulling furnace suitable for carrying out a manufacturing method of a hydrogen-doped silicon single crystal.

This CZ pulling furnace has a different structure for the gas-discharge unit 15 from the CZ pulling furnace described above. Other structures are essentially the same as those of the CZ pulling furnace described above and the explanation thereof is omitted by assigning the same number to the corresponding part.

The gas-discharge unit 15 in this furnace has a cylindrical header 22 which is placed at the outer side of the draw tube 14 inserted in the main chamber 1. The header 22 is a double cylinder structure composed of the draw tube 14 and a cylindrical outer shell placed at the outer side thereof, and the bottom of the header 22 has a plurality of nozzle holes formed at equal intervals around the entire circumference; the header 22 is connected to the gas source 12 via the pipe 18 which is independent from the pipe 13 connecting the upper part of the pull chamber 4 to the gas source 12.

During the operation, the mixed gas of hydrogen gas and an inert gas is supplied from the gas source 12 to the pull chamber 4. Simultaneously, this mixed gas is also supplied to the header 22 of the gas-discharge unit 15. The mixed gas supplied to the header 22 is discharged in a downward direction from the plurality of nozzle holes formed at the bottom of the header into the main chamber 1. The mixed gas discharged in the downward direction into the main chamber 1, as in the aforementioned case of the CZ pulling furnace, strikes at point-blank range mainly the surface of the molten raw material 20 in the crucible 5, more specifically the surface area covering from the single crystal 21 to its outer peripheral region. Consequently, the hydrogen gas in the mixed gas discharged from the plurality of nozzle holes effectively acts to prevent the single crystal 21 from forming vacancy defects.

Figure 3:
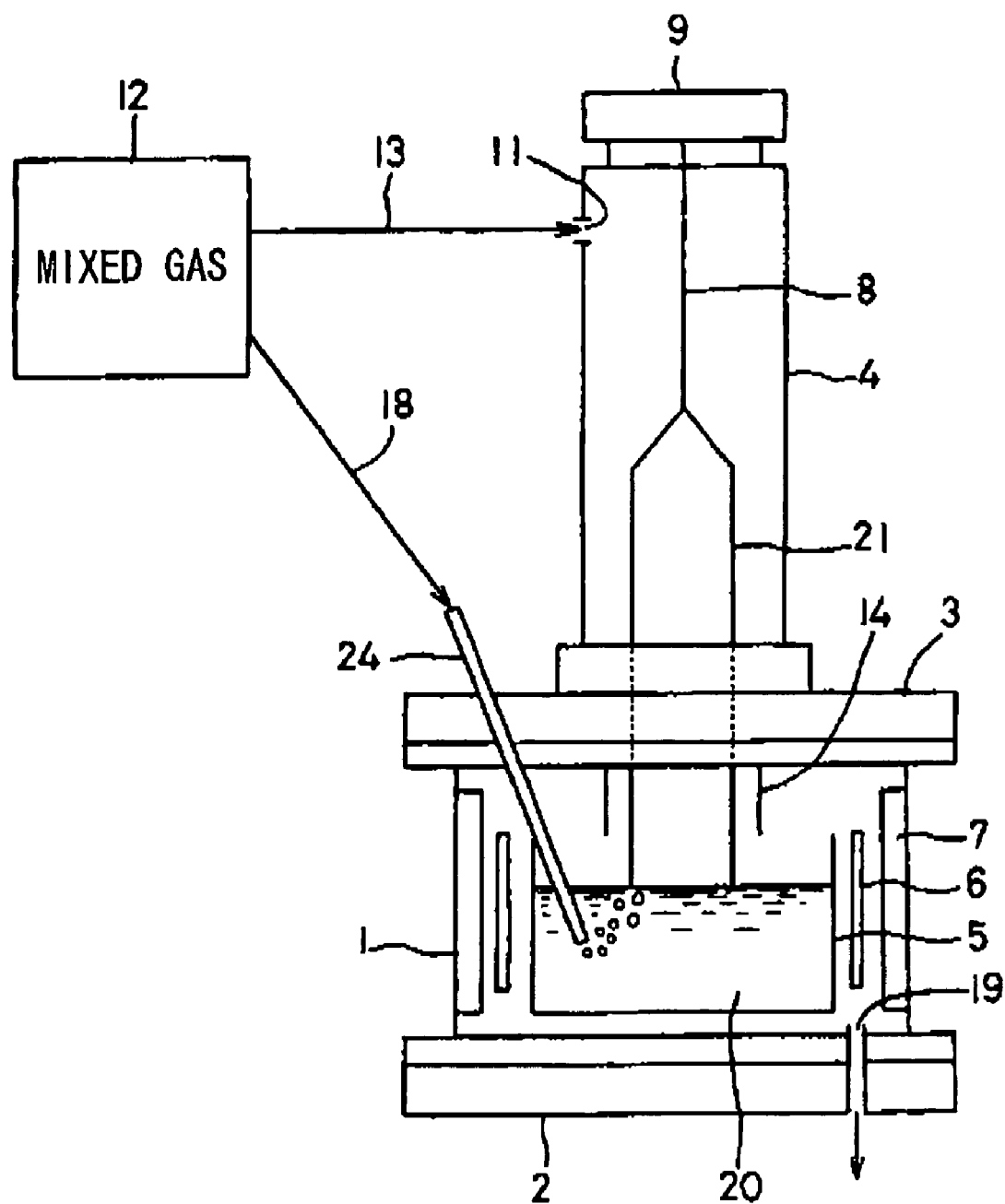
FIG. 3 is a schematic view of another CZ pulling furnace suitable for a manufacturing method of a hydrogen-doped silicon single crystal according to the invention.

FIG. 3 is a schematic view of still another CZ pulling furnace suitable for carrying out a manufacturing method of a hydrogen-doped silicon single crystal according to the invention.

The manner by which this CZ pulling furnace supplies the mixed gas to the molten raw material 20 in the crucible 5 is different from those of the two CZ pulling furnaces described above. The two aforementioned CZ pulling furnaces spray the mixed gas from the circular gas-discharge unit 15 to the surface of the molten raw material 20, more specifically to the adjacent parts to the solid-liquid interface of the melt surface; on the contrary, in this CZ pulling furnace, the mixed gas is injected in the molten raw material 20 by employing a quartz funnel tube 24 which penetrates the top chamber 3 and is inserted in the main chamber 1 to be dipped in the molten raw material 20 in the crucible 5.

By employing this manner, the mixed gas discharged in the furnace is also directly supplied to the molten raw material 20 and the distance for the gas to travel to reach the molten raw material 20 is significantly reduced to substantially zero; this enables the prevention of unnecessary hydrogen consumption due to the adsorption of hydrogen gas in the mixed gas by the carbon members while passing through the furnace. The hydrogen gas is efficiently taken in by silicon before solidification to effectively suppress vacancy aggregation, and useless hydrogen intake to the single crystal 21 is prevented. As a result of the effective hydrogen intake, the hydrogen is doped in the silicon in a predetermined concentration before its solidification, resulting in the production of a high quality hydrogen-doped single crystal 21 in which the generation of vacancy defects is effectively suppressed.

EXAMPLES

As examples of the invention, in the embodiment represented by FIG. 1, mixed gases having various hydrogen concentrations were individually supplied to the furnace from the pull chamber top and the ring-type header to investigate the relationship between hydrogen concentration in the mixed gas and hydrogen concentration in the single crystal. As comparative examples, the total amount of the mixed gas was supplied to the furnace from the pull chamber top to investigate the relationship between hydrogen concentration in the mixed gas and hydrogen concentration in the single crystal. The results are shown in Table 1.

TABLE 1

| | | Hydrogen Concentration in Mixed Gas (%) | | | | |
|---|---|---|---|---|---|---|
| | | 1 | 3 | 5 | 10 | 15 |
| Presence of Peak | Comparative Example | — | — | — | small | high |
| | Example | — | small | high | high | high |

The crystal diameter was 150 mm, the tube diameter of the ring-type header employed in the invention was 10 mm, the inner diameter of the ring was 165 mm, and the ratio of the mixed gas separated to the gas-discharge tube was 50%. The hydrogen concentration in the crystal was measured by light absorption spectroscopy (FT-IR). When a hydrogen concentration in a crystal is sufficient a peak of silicon-hydrogen complex is observed by light absorption spectroscopy; according to the size of the peak present, it is determined whether the hydrogen concentration is adequate or not. In the table, "high" represents a sufficient peak size, "small" represents small peak size, and slash represents no absorption peak.

As can be understood from Table 1, in the Examples of the invention, the silicon-hydrogen complex peak was observed in a range around 3% hydrogen concentration in the mixed gas; this shows that the hydrogen concentration in which the complex's peak can be observed shifts toward the low hydrogen concentration side in comparison with the Comparative Examples. This indicates that the hydrogen directly supplied to the silicon melt surface was efficiently taken in the crystal. Hydrogen was sufficiently taken in the crystal at a 5% hydrogen concentration, thus enabling low hydrogen concentration operation, which is safer than the conventional methods.

Consequently, it is possible with the invention for hydrogen to be sufficiently introduced into crystal in the low hydrogen concentration range, which is advantageous in view of safety.

In the examples described above, all of the gas atmosphere introduced into the furnace was mixed gas, and a portion of the mixed gas was directly supplied at point-blank range to the molten raw material in the main chamber and the rest of the mixed gas was introduced into the furnace from the pull chamber top; however, the whole mixed gas may be directly supplied at point-blank range to the molten raw material in the main chamber. Alternatively, a portion of the gas atmosphere to be introduced into the furnace may be used as a mixed gas to be directly supplied at point-blank range to the molten raw material in the main chamber. In this case, the rest of the atmosphere gas is only an inert gas and, for example, is introduced into the furnace from the pull chamber top.

According to the above explanation, the manufacturing method of a hydrogen-doped silicon single crystal of the invention limits the passage in a short length through which a hydrogen gas introduced into a furnace travel to reach a silicon melt in a crucible, wherein the silicon single crystal is grown by the CZ method under an inert gas atmosphere containing the hydrogen; this prevents the hydrogen gas from being arrested on the way and the hydrogen gas intake by the silicon crystal, effectively utilizing the hydrogen gas. Consequently, the methods can produce high quality hydrogen-doped silicon single crystals in which the hydrogen amount is sufficiently and exactly administered, without increasing the hydrogen gas concentration in the mixed gas and under safe conditions.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A manufacturing method of a hydrogen-doped silicon single crystal by growing silicon single crystal from a silicon melt stored in a crucible, under an inert atmosphere containing hydrogen, in a CZ pulling furnace in which a pull chamber is connected to a main chamber, said method comprising:

introducing a mixed gas composed of a hydrogen gas and an inert gas into the CZ pulling; and discharging at least a portion of the mixed gas from a nozzle in the main chamber such that at least a portion of the mixed gas is directly supplied to a surface of the silicon melt in the crucible without passing through the pull chamber.

2. A manufacturing method of a hydrogen-doped silicon single crystal according to claim 1, wherein at least one portion of the mixed gas is supplied directly to adjacent parts to a solid-liquid interface on a surface of the silicon melt.

3. A manufacturing method of a hydrogen-doped silicon single crystal according to claim 1, wherein at least one portion of the mixed gas is sprayed to a surface of the silicon melt from a circular gas-discharge unit placed adjacent to the surface of the silicon melt and encircles the silicon single crystal in the main chamber.

4. A manufacturing method of a hydrogen-doped silicon single crystal by growing a silicon single crystal from a silicon melt stored in a crucible, under an inert gas atmosphere containing hydrogen, by the CZ method, said method comprising:

introducing a mixed gas composed of a hydrogen gas and an inert gas into the pulling furnace; and injecting at least a portion of the mixed gas directly into the silicon melt.

5. The manufacturing method of a hydrogen-doped silicon single crystal according to claim 4, wherein at least a portion of the mixed gas is directly injected into the silicon melt through a funnel tube dipped in the melt.

* * * * *